(12) United States Patent
Kim

(10) Patent No.: US 8,633,826 B2
(45) Date of Patent: Jan. 21, 2014

(54) METHOD AND APPARATUS FOR MANAGING BATTERY PACK

(75) Inventor: Ju-Young Kim, Daejeon (KR)

(73) Assignee: LG Chem, Ltd. (KR)

( * ) Notice: Subject to any disclaimer, the term of this patent is extended or adjusted under 35 U.S.C. 154(b) by 359 days.

(21) Appl. No.: 13/088,571

(22) Filed: Apr. 18, 2011

(65) Prior Publication Data

US 2011/0210859 A1    Sep. 1, 2011

Related U.S. Application Data

(63) Continuation of application No. PCT/KR2010/008574, filed on Dec. 2, 2010.

(30) Foreign Application Priority Data

Dec. 30, 2009  (KR) .................. 10-2009-0134432

(51) Int. Cl.
  *G08B 21/00*    (2006.01)
  *G01N 27/416*   (2006.01)

(52) U.S. Cl.
  USPC .......... 340/657; 340/636.1; 340/636.13; 340/636.16; 340/636.18; 340/636.19; 340/449; 340/438; 340/455; 320/132; 320/134; 320/149; 429/431; 701/29.1; 702/63

(58) Field of Classification Search
  None
  See application file for complete search history.

(56) References Cited

U.S. PATENT DOCUMENTS

| | | | | |
|---|---|---|---|---|
| 4,888,716 A | * | 12/1989 | Ueno ................. | 702/63 |
| 4,947,123 A | * | 8/1990 | Minezawa .......... | 324/427 |
| 5,065,084 A | * | 11/1991 | Oogita ............... | 320/136 |
| 6,023,150 A | * | 2/2000 | Patino et al. ....... | 320/132 |
| 6,501,249 B1 | * | 12/2002 | Drori ................. | 320/149 |
| 7,576,517 B1 | * | 8/2009 | Cotton et al. ...... | 320/136 |
| 7,728,552 B2 | * | 6/2010 | Burns ................ | 320/116 |
| 8,232,886 B2 | * | 7/2012 | Kawai et al. ....... | 340/636.1 |
| 2008/0024089 A1 | * | 1/2008 | Meng et al. ........ | 320/128 |
| 2008/0118819 A1 | * | 5/2008 | Gamboa et al. .... | 429/61 |
| 2010/0138178 A1 | * | 6/2010 | Paryani et al. ..... | 702/63 |

FOREIGN PATENT DOCUMENTS

| | | |
|---|---|---|
| JP | 2003-009406 A | 1/2003 |
| JP | 2003173825 A | 6/2003 |
| JP | 2007-082375 A | 3/2007 |
| JP | 2009-195036 A | 8/2009 |
| JP | 2009284717 A | 12/2009 |
| JP | 2009302054 A | 12/2009 |
| KR | 20060087837 A | 8/2006 |
| KR | 20090046474 A | 5/2009 |

\* cited by examiner

*Primary Examiner* — Benjamin C Lee
*Assistant Examiner* — Rajsheed Black-Childress
(74) *Attorney, Agent, or Firm* — Lerner, David, Littenberg, Krumholz & Mentlik, LLP

(57) ABSTRACT

An apparatus for managing a battery pack for a vehicle includes a temperature measurement module for measuring temperature of the battery pack; a current measurement module for measuring a charge/discharge current of the battery pack when the measured temperature is not within a predetermined temperature range; a time measurement module for measuring the time while the measured charge/discharge current is over a predetermined current value; a storage module for accumulating and storing the measured time; and a control module for determining a state of the battery pack according to the accumulated and stored time and providing the state information to a user.

14 Claims, 3 Drawing Sheets

FIG. 3

| WARNING POINT | STATE INFORMATION |
|---|---|
| 10 | 3$^{RD}$ WARNING          WARNING LEVEL 2 |
| 9 | |
| 8 | |
| 7 | |
| 6 | |
| 5 | 2$^{ND}$ WARNING |
| 4 | |
| 3 | 1$^{ST}$ WARNING          WARNING LEVEL 1 |
| 2 | |
| 1 | | ns # METHOD AND APPARATUS FOR MANAGING BATTERY PACK

CROSS-REFERENCE TO RELATED APPLICATION

This application is a continuation of International Application No. PCT/KR2010/008574 filed on Dec. 2, 2010, which claims priority to Korean Patent Application No. 10-2009-0134432 filed in Republic of Korea on Dec. 30, 2009, the entire contents of which are incorporated herein by reference.

FIELD OF THE INVENTION

The present invention relates to method and apparatus for managing a battery pack, and more particularly, to method and apparatus for detecting a situation of ultimately severe temperature or high current, which may give an influence on the life or performance of the battery pack, and providing correct state information about the battery pack for a vehicle.

BACKGROUND OF THE INVENTION

As the demands for portable electronic products such as notebooks, video cameras and cellular phones are rapidly increased in these days, and development of electric vehicles, energy storage batteries, robots, satellites, etc. is under active progress, numerous studies are being made on high-performance secondary batteries capable of being repeatedly charged and discharged.

Currently, nickel-cadmium batteries, nickel-hydrogen batteries, nickel-zinc batteries, lithium secondary batteries or the like are commercially available as secondary batteries. Among them, lithium secondary batteries are the center of interest because they hardly have memory effects and can be freely charged or discharged when compared with nickel-based secondary batteries. Advantageously, lithium secondary batteries also exhibit very low self-discharge and high energy density.

In particular, in these days, as carbon energies are gradually exhausted and the interest on environments is increased, hybrid vehicles and electric vehicles become the focus of the public attention not only in U.S.A, Europe, Japan, and Korea but also in all countries in the world. In such hybrid or electric vehicles, the most fundamental part is a battery that gives a driving force to a vehicle motor. Since the hybrid or electric vehicle may obtain a driving force by means of charging/discharging of the battery, the hybrid or electric vehicle may eliminate or reduce an exhausted pollutant while ensuring excellent fuel efficiency, and thus the hybrid or electric vehicle is used more and more.

However, the vehicle battery used for such a hybrid or electric vehicle may encounter severe circumstances frequently in the consideration that it is mounted to a vehicle, differently from batteries used for general portable electronic products. For example, in a case where a vehicle runs in a polar region or in a very cold winter, the battery should be operated though the temperature is very low. In addition, in a case where a vehicle runs at the equator or in a very hot summer, the battery should be operated though the temperature is very high.

If a high current flows in the battery so as to transfer a high driving force to a vehicle in an ultimately severe temperature circumstance, the high current may give a bad influence on the life and performance of the battery. In other words, the ultimately severe operation condition of the battery may shorten the life of the battery and weaken the performance in comparison to normal operation conditions. Nevertheless, in the conventional art, though a battery is exposed to severe operation conditions, relevant data is not provided to a driver or a repair man. For this reason, a vehicle driver or the like could not properly check that the life and performance of a battery are deteriorated since the battery is used in ultimately severe operation conditions. Thus, it is not easy to check a suitable time for repair or exchange, which may result in even a breakdown or failure of the battery or a malfunction of the battery. If the battery stops its function, a user may experience inconvenience since the vehicle cannot run. In addition, if the battery stops its function while the vehicle is running, a car accident may occur, which may seriously damage lives and properties. Moreover, since the operation history of the battery pack is not properly checked even when the vehicle or the battery pack is repaired, it is not easy to exactly diagnose the state of the battery pack.

SUMMARY OF TEE INVENTION

The present invention is designed to solve the problems of the prior art, and therefore, it is an aspect of the present invention to provide method and apparatus for managing a battery pack, which may provide state information of the battery pack for a vehicle so that a suitable time for repair or exchange about the battery pack for a vehicle may be informed.

These and other aspects and advantages will be apparent from the embodiments of the present invention. And, the aspects and advantages of the invention may be realized by means of instrumentalities and combinations particularly pointed out in the appended claims.

In order to accomplish the above object, the present invention provides an apparatus for managing a battery pack for a vehicle, which includes a temperature measurement module for measuring temperature of the battery pack; a current measurement module for measuring a charge/discharge current of the battery pack when the measured temperature is not within a predetermined temperature range; a time measurement module for measuring the time while the measured charge/discharge current is over a predetermined current value; a storage module for accumulating and storing the measured time; and a control module for determining a state of the battery pack according to the accumulated and stored time and providing the state information to a user.

In addition, in order to accomplish the above object, the present invention provides a battery pack including the above battery pack managing apparatus.

Also, in order to accomplish the above object, the present invention provides a vehicle including the above battery pack managing apparatus.

In addition, in order to accomplish the above object, the present invention provides a method for managing a battery pack, which includes (S1) measuring temperature of the battery pack; (S2) measuring a charge/discharge current of the battery pack when the measured temperature is not within a predetermined temperature range; (S3) measuring the time while the measured charge/discharge current is over a predetermined current value; (S4) accumulating and storing the measured time; and (S5) determining a state of the battery according to the accumulated and stored time and providing the state to a user.

According to the present invention, histories of a battery pack for a vehicle, which was used in ultimately severe operation conditions, may be clearly checked, and relevant information may be stored. The information may be used as data for clearly checking a factor deteriorating the life and performance of the battery pack for a vehicle. For example, the data may be referred to when checking a state of the battery pack, such as SOH (State Of Health).

Thus, the state information of the battery pack for a vehicle may be exactly and properly provided to a driver or a vehicle repair man. Since the driver may predict a suitable time for repairing or exchanging the battery pack for a vehicle in advance, it is possible to prevent any unnecessary exchange or repair of the battery pack or any accident or unintended stop of the vehicle, caused by the malfunction of the battery pack. In addition, since the driver may know that the battery is used in an ultimately severe operation condition, the driver may try not to run the vehicle in a condition harmful for the life and performance of the battery pack if possible.

In addition, since a vehicle repair man may clearly check the situation informing that the battery pack was operated in a bad condition, the battery pack may be exactly diagnosed and repaired when the vehicle is under the maintenance service.

BRIEF DESCRIPTION OF THE DRAWINGS

FIG. 3 shows one example of a table illustrating state information of the battery pack, which is provided to a user by a control module per each warning point endowed in accordance with an accumulated time.

DETAILED DESCRIPTION OF THE INVENTION

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation.

Therefore, the description proposed herein is just a preferable example for the purpose of illustrations only, not intended to limit the scope of the invention, so it should be understood that other equivalents and modifications could be made thereto without departing from the spirit and scope of the invention.

Figure 1:
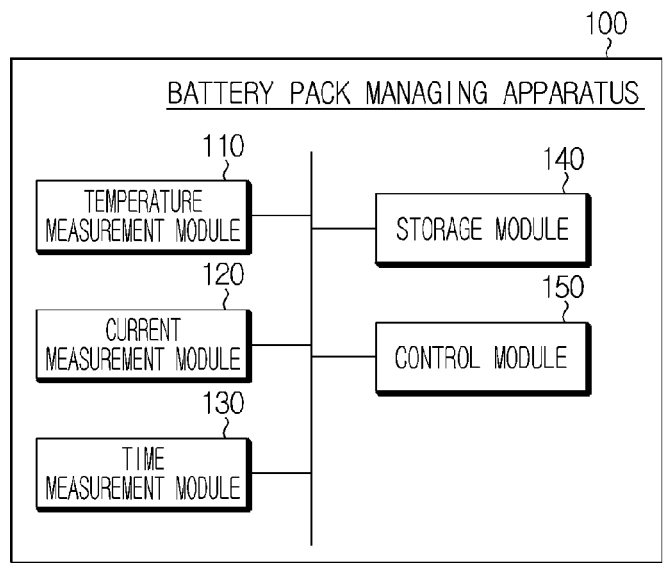
FIG. 1 is a block diagram schematically showing a functional configuration of an apparatus for managing a battery pack according to one embodiment of the present invention.
Figure 2:
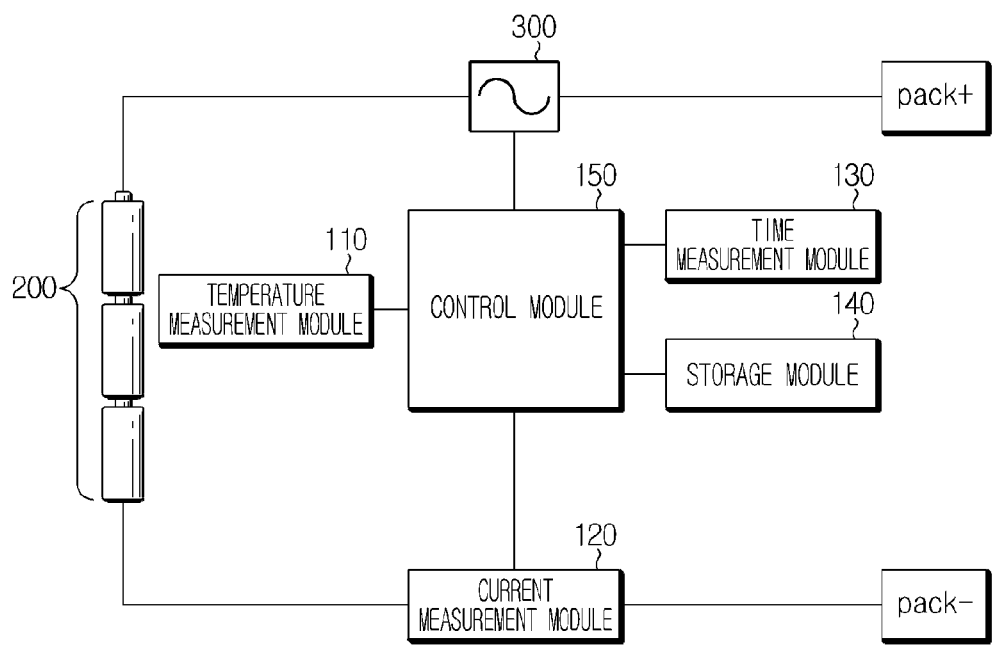
FIG. 2 shows a connection configuration of the apparatus for managing a battery pack according to one embodiment of the present invention, which is on a charging/discharging path of the battery pack.

FIG. 1 is a block diagram schematically showing a functional configuration of an apparatus 100 for managing a battery pack according to one embodiment of the present invention, and FIG. 2 shows a connection configuration of the apparatus 100 for managing a battery pack, which is on a charging/discharging path of the battery pack.

Referring to FIGS. 1 and 2, the battery pack managing apparatus 100 according to the present invention includes a temperature measurement module 110, a current measurement module 120, a time measurement module 130, a storage module 140, and a control module 150.

The temperature measurement module 110 measures temperature of a battery pack. Preferably, the temperature measurement module 110 may be realized with a thermo coupler. However, the present invention is not limited to a specific form of the temperature measurement module 110, and various kinds of temperature measurement modules 110 known in the art may be selected.

Preferably, the temperature measurement module 110 includes an interior temperature measurement module and an exterior temperature measurement module, so that both interior and exterior temperatures of the battery pack may be measured. In this case, the exterior temperature and the interior temperature of the battery pack may be considered together, so that surrounding temperature may be checked in detail as conditions at which the battery pack is operated.

The current measurement module 120 measures a charge/discharge current of the battery pack, when the measured temperature is not within a predetermined temperature range. In other words, if the temperature of the battery pack, measured by the temperature measurement module 110, is higher or lower than a criterion temperature range, the current measurement module 120 initiates to measure the charge/discharge current of the battery pack. At this time, the temperature range that is used as a basis for determining whether the current measurement module 120 initiates to measure the charge/discharge current of the battery pack may be stored in a storage device, such as the storage module 140, in advance.

The current measurement module 120 may be realized in various types. For example, the current measurement module 120 may measure a current by detecting a voltage applied to a sense resistor installed on a charging/discharging path. In other cases, various kinds of current measurement modules 120 known in the art may be used, and the present invention is not limited to any specific example of the current measurement module 120.

Meanwhile, in a case where the temperature measurement module 110 measures both interior and exterior temperatures, the current measurement module 120 considers both of the measured interior and exterior temperatures in order to determine whether or not to measure a current. For example, the current measurement module 120 may initiate to measure a current when the interior temperature of the battery pack measured by the temperature measurement module 110 is 60° C. or above and the exterior temperature is higher than the interior temperature.

When the charge/discharge current of the battery pack measured by the current measurement module 120 is over a predetermined current value, the time measurement module 130 measures the time during which the charge/discharge current is over the predetermined current value. In other words, in a state that the temperature is very high or very low, the time measurement module 130 measures the time during which a high current flows in the battery pack.

For example, the time measurement module 130 may measure the time during which the charge/discharge current measured by the current measurement module 120 is 10 C or above. Here, the unit "C" means a basic current amount of a general battery cell 200, and 10 C means 10 times of a basic current amount of a general battery cell 200. The condition based on which the time measurement module 130 initiates time measurement, in other words a predetermined current value that is a basis for determining high current, may be stored in a storage device, such as the storage module 140, in advance.

The time measurement module 130 may measures the time during which a high current over a predetermined value flows in the battery pack, in a predetermined time unit, for example 10 ms. In this case, the time during which a high current flows may be measured precisely.

However, the predetermined current value and the time measurement unit, mentioned above, are just examples, and it is obvious to those of ordinary skill in the art that the present invention is not limited to such numerals.

The storage module 140 accumulates and stores the time measured by the time measurement module 130. In other words, the storage module 140 accumulates and stores how long the high current flows in the battery pack in an extremely severe temperature condition.

For example, in a case where the battery pack has a temperature of 60° C. and the charge/discharge current is 10 C or above, if a current satisfying this condition is measured initially for 2 seconds, then for 5 seconds, and then for 4 seconds, the storage module 140 may store 11 seconds in total as the measurement time. At this time, the storage module 140 may also store individual measurement times, in addition to the accumulated measurement time.

In addition, the storage module 140 may store data or program required for executing functions of the temperature measurement module 110, the current measurement module 120, the time measurement module 130, and the control module 150. For example, the storage module 140 may store the predetermined temperature range that is a condition for determining whether the current measurement module 120 measures a current, and the predetermined current value that is a basis for determining whether the time measurement module 130 measures time.

The storage module 140 may include a volatile memory such as RAM or a non-volatile memory such as a hard disk. In particular, the accumulated value of time measured by the time measurement module 130 may be stored in a non-volatile memory. In this case, a driver or a repair man may easily check histories of the battery pack according to the accumulated value stored in the non-volatile memory and refer to the histories as data for the repairing work.

The control module 150 determines a state of the battery pack in accordance with the time accumulated and stored in the storage module 140, and provides the determined state information to a user. For example, the control module 150 may provide the state information of the battery pack to the user when the accumulated and stored time during which a high current flows in the battery pack in an extremely severe temperature condition reaches a predetermined time.

Here, the state information means information provided for informing a user that the battery pack is used in operation conditions by which a bad influence may be given to the performance or life of the battery pack. For example, the control module 150 may send to a user a message informing that caution is required when running the vehicle or the battery pack should be examined since the battery pack is used over a predetermined time in a situation harmful for the battery pack. In addition, the control module 150 may send a message informing that the battery pack should be exchanged.

Here, the method for providing the state information to a user may be executed in various ways. For example, a warning may be given to a user by turning on a warning lamp with a green or red color or by generating an alarm. In other case, a message may be sent with a text through a display such as an LCD provided at the driver's seat. For this purpose, the control module 150 may be connected to a warning lamp, an alarm generator, a display, and so on through an interface.

In order to determine the time at which the control module 150 provides the state information of the battery pack to a user, various methods may be used.

Preferably, the control module 150 may endow a warning point per a predetermined accumulated time. For example, the control module 150 may endow 1 point as a warning point when the time accumulated and stored in the storage module 140 due to the flow of a high current reaches every 5 seconds. After that, the control module 150 may provide the state information of the battery pack in stages in accordance with the endowed warning points. However, the term 'warning point' used herein is just one example, which means a score endowed according to the time, and various terms may be used instead.

FIG. 3 shows one example of a table illustrating state information of the battery pack, which is provided to a user by the control module 150 per each warning point endowed in accordance with the accumulated time.

Referring to FIG. 3, when the endowed warning point reaches 3 points, the control module 150 may give a first warning and determines the situation as a warning level 1. At this time, the control module 150 may give a warning to a user in various ways. For example, the control module 150 may gives a first warning to the user by turning on a green lamp. This first warning may be interpreted in a way that caution is required when using the battery pack, and the meaning of the first warning as above may be informed in advance to a user by means of a vehicle manual or the like. In other case, the meaning may be transferred by means of text or picture through a vehicle display or the like.

Then, if the warning point reaches 5 points, the control module 150 gives a second warning to the user. Even at this time, the control module 150 may give the second warning to the user by turning on a lamp. However, a lamp different from that of the first warning, for example a red lamp may be used so that the user may exactly recognize the second warning. The second warning corresponds to the information informing that the situation is more serious than the first warning, for example requiring the battery pack to be examined. The meaning of the second warning as above may also be informed in advance to the user by means of a vehicle display, a vehicle manual, or the like.

After that, if the warning point is accumulated to 10 points, the control module 150 may gives a third warning to the user and determines that the situation is in a warning level 2. This third warning may be transferred to the user as a meaning informing that the battery is used up or deteriorated and thus should not be used any more. Also, if the situation comes to the warning level 2, this state information is stored in the storage module 140 such as a non-volatile memory so that a vehicle repair man will refer to the information.

Meanwhile, the point classification and the state information based on each warning points, shown in FIG. 3, are just one embodiment, and it is obvious to those having ordinary skill in the art that they may be implemented in various ways.

In a case where the warning points are endowed as in the above embodiment, the control module 150 may interrupt a charging/discharging path of the battery if the endowed warning point reaches a predetermined point. For example, if the warning point reaches 10 points and thus it is determined that the situation comes to the warning level 2 in the above embodiment shown in FIG. 3, the control module 150 may interrupt the charging/discharging path of the battery pack so that the battery pack cannot be used any more. In this case, since the battery pack is used in an ultimately severe condition for a long time, the battery pack may be entirely broken or stop its function to cause a car accident if the battery pack is used more. Thus, the use of the battery pack is limited to prevent any car accident in advance. However, at this time, the fact that the charging/discharging path will be interrupted may be informed to the user in advance so that the user may cope with the interruption of the battery pack.

More preferably, in a case where the control module 150 interrupts the charging/discharging path of the battery pack, the number of interruptions may be accumulated and stored in the storage module 140. For example, whenever the charging/discharging path of the battery pack is interrupted as the warning point reaches 10 points in the embodiment of FIG. 3, the number of interruptions may be stored in the storage module 140. Thus, from the number of interruptions stored in the storage module 140, the history about the fact that the battery pack is used in an ultimately severe condition may be referred to by a driver or a repair man so that the driver or the repair man may easily check the performance or life of the battery pack. Preferably, the number of interruptions may be used for calculating SOH (State Of Health) by means of a predetermined conversion formula. Meanwhile, the number of interruptions is preferably not able to being distorted but stored in a non-volatile memory.

In addition, in the embodiment of FIG. 3, the warning point may be endowed up to 10 points, and if the warning point becomes 10 points and thus the charging/discharging path of the battery pack is interrupted, the warning point may be initialized to 0 point. It is because the warning points accumulated before the initialization can be sufficiently considered through the number of interruptions to the charging/discharging path of the battery pack. However, it is also possible to continuously endow warning points to 11, 12, or the like, without initializing the warning point.

Meanwhile, the control module 150 may interrupt the charging/discharging path by melting and cutting a fuse 300 installed on the charging/discharging path of the battery pack as shown in FIG. 2, but the present invention is not limited only to the interruption manner.

The battery pack according to the present invention may include the battery pack managing apparatus as described above. Also, a vehicle, particularly an electric vehicle according to the present invention may include the battery pack managing apparatus as described above.

Figure 4:
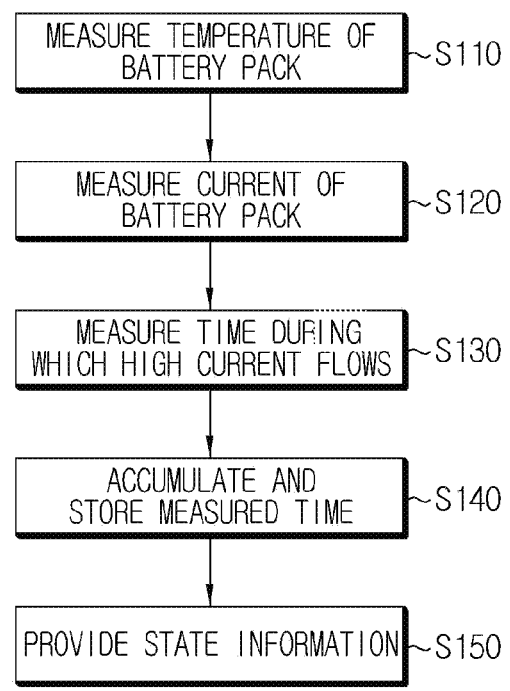
FIG. 4 is a flowchart schematically illustrating a method for managing a battery pack according to one embodiment of the present invention.

FIG. 4 is a flowchart schematically illustrating a method for managing a battery pack according to one embodiment of the present invention.

Referring to FIG. 4, first, the temperature measurement module 110 measures temperature of a battery pack and outputs the measured temperature data to the control module 150 (S110). Here, it is desirable to measure both interior and exterior temperatures of the battery pack. Then, if the measured temperature is not within a predetermined temperature range, the control module 150 controls the current measurement module 120 to measure a charge/discharge current of the battery pack (S120). At this time, in a case where the interior and exterior temperatures of the battery pack are measured together as mentioned above, the charge/discharge current may be measured when the measured interior temperature is 60° C. or above and the exterior temperature is higher than the interior temperature.

Then, if the measured charge/discharge current is a high current over a predetermined current value, the control module 150 controls the time measurement module 130 to measure the time during which the high current flows (S130). At this time, the predetermined current value, in other words a criterion value based on which the high current is determined, may be 10 C. After that, the control module 150 accumulates and stores the time measured in the step S130 (S140), and then determines the state of the battery pack in accordance with the accumulated and stored time and provides the state information (S150). Here, in the step S150, a warning point may be endowed per a predetermined accumulated time, and the state information of the battery pack may be provided in stages in accordance with the endowed warning point. More preferably, there may be provided a further step of interrupting a charging/discharging path of the battery pack, when the endowed warning point reaches a predetermined value in the step S150. At this time, the number of interruptions of the charging/discharging path may be accumulated and stored. Meanwhile, in the step S150, the state information of the battery pack may be provided to a user by means of a warning lamp, an alarm generator, a display, or the like.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

Meanwhile, in this specification, the term 'module' is used, but it is obvious to those having ordinary skill in the art that the term 'module' just represents a logic unit, which may not be a component that can be physically separated.

What is claimed is:

1. An apparatus for managing a battery pack for a vehicle comprising:
 a temperature measurement module for measuring temperature of the battery pack;
 a current measurement module for measuring a charge/discharge current of the battery pack when the measured temperature is not within a predetermined temperature range;
 a time measurement module for measuring a time while the measured charge/discharge current is over a predetermined current value;
 a storage module for accumulating and storing the measured time; and
 a control module for determining a state of the battery pack according to the accumulated and stored time and providing the state information to a user.

2. The apparatus for managing a battery pack according to claim 1, wherein the temperature measurement module measures both interior and exterior temperatures of the battery pack.

3. The apparatus for managing a battery pack according to claim 2, wherein the current measurement module measures a charge/discharge current of the battery pack when the measured interior temperature of the battery pack is over a predetermined criterion temperature and the measured exterior temperature is higher than the measured interior temperature.

4. The apparatus for managing a battery pack according to claim 1, wherein the control module endows a warning point per a predetermined accumulated time and provides state information of the battery pack in stages in accordance with the endowed warning point.

5. The apparatus for managing a battery pack according to claim 4, wherein the control module interrupts a charging/discharging path of the battery pack when the endowed warning point reaches a predetermined level.

6. The apparatus for managing a battery pack according to claim 5, wherein the control module accumulates the number of interruptions when interrupting the charging/discharging path, and stores the number of interruptions in the storage module.

7. The apparatus for managing a battery pack according to claim 1, wherein the control module provides state information of the battery pack to a user by means of a warning lamp, an alarm generator, or a display.

8. A method for managing a battery pack for a vehicle, comprising:
- (S1) measuring temperature of the battery pack;
- (S2) measuring a charge/discharge current of the battery pack when the measured temperature is not within a predetermined temperature range;
- (S3) measuring a time while the measured charge/discharge current is over a predetermined current value;
- (S4) accumulating and storing the measured time; and
- (S5) determining a state of the battery pack according to the accumulated and stored time and providing the state information to a user.

9. The method for managing a battery pack according to claim 8, wherein, in the step (S1), the temperature of both interior and exterior temperatures of the battery pack are measured.

10. The method for managing a battery pack according to claim 9, wherein, in the step (S2), the charge/discharge current of the battery pack is measured when the measured interior temperature of the battery pack is over a predetermined criterion temperature and the measured exterior temperature is higher than the measured interior temperature.

11. The method for managing a battery pack according to claim 8, wherein, in the step (S5), a warning point is endowed per a predetermined accumulated time, and the state information of the battery pack is provided in stages in accordance with the endowed warning point.

12. The method for managing a battery pack according to claim 11, wherein a charging/discharging path of the battery pack is interrupted when the warning point endowed in the step (S5) reaches a predetermined level.

13. The method for managing a battery pack according to claim 12, further comprising accumulating the number of interruptions when interrupting the charging/discharging path, and storing the number of interruptions.

14. The method for managing a battery pack according to claim 8, wherein, in the step (S5), the state information of the battery pack is provided to a user by means of a warning lamp, an alarm generator, or a display.

* * * * *